United States Patent [19]

Hill

[11] Patent Number: 4,599,607
[45] Date of Patent: Jul. 8, 1986

[54] ACOUSTIC KEYBOARD

[75] Inventor: Lawrence R. Hill, New York, N.Y.

[73] Assignee: General Instrument Corporation, New York, N.Y.

[21] Appl. No.: 547,124

[22] Filed: Oct. 31, 1983

[51] Int. Cl.$^4$ .............................................. H04L 1/00
[52] U.S. Cl. ............................ 340/365 R; 178/17 C; 340/365 P; 400/477
[58] Field of Search .......... 340/365 R, 365 P, 365 A; 178/17 C, 19; 400/477, 479

[56] References Cited

U.S. PATENT DOCUMENTS

| | | | |
|---|---|---|---|
| 3,647,962 | 3/1972 | Whetstone | 178/17 C |
| 3,745,564 | 7/1973 | Gandolfo et al. | 340/365 A |
| 4,028,619 | 6/1977 | Edwards | 324/34 PS |
| 4,311,991 | 1/1982 | Rimbey | 340/365 R |
| 4,317,005 | 2/1982 | de Bruyne | 178/19 |
| 4,319,189 | 3/1982 | Cullum, Jr. et al. | 324/208 |
| 4,379,968 | 4/1983 | Ely et al. | 340/365 P |
| 4,384,633 | 5/1983 | Hoyer-Ellefsen | 400/477 |
| 4,384,795 | 5/1983 | Lutes | 400/477 |

OTHER PUBLICATIONS

'Electronic Keyboard', R. R. Lisk, IBM Technical Disclosure Bulletin, vol. 20, No. 1, Jun. 1977.
'Acoustical Touch Panel', J. Fajans, IBM Technical Disclosure Bulletin, vol. 20, No. 7, Dec. 1977.

Primary Examiner—John W. Caldwell, Sr.
Assistant Examiner—Brent A. Swarthout
Attorney, Agent, or Firm—Barry R. Lipsitz

[57] ABSTRACT

An acoustic keyboard comprises a plurality of keys arranged in a matrix. A plurality of reflector members, each one associated with a different one of the keys, reflect acoustic energy when the associated key is actuated. Acoustic energy is emitted from a transducer for reflection from the actuators. The reflected energy is detected, and the actuated key is identified based upon the transit time of acoustic energy from the transducer to the detector via reflection off of the reflector member associated with the actuated key.

13 Claims, 3 Drawing Figures

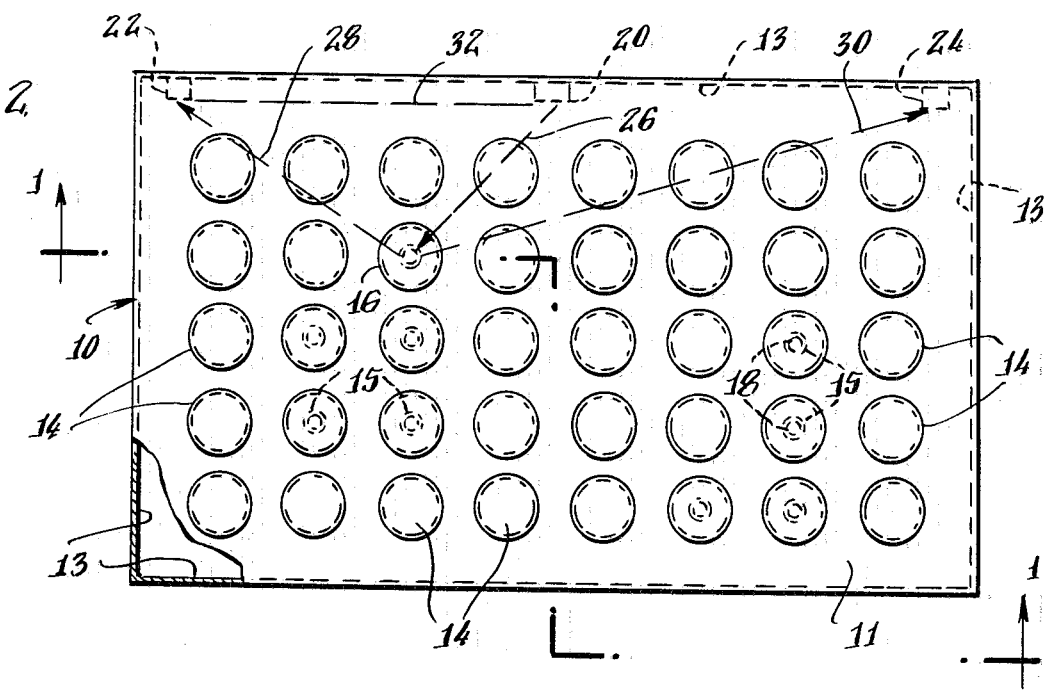
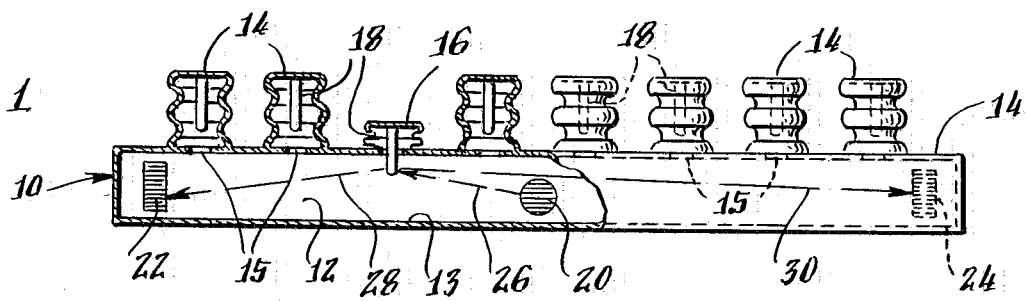
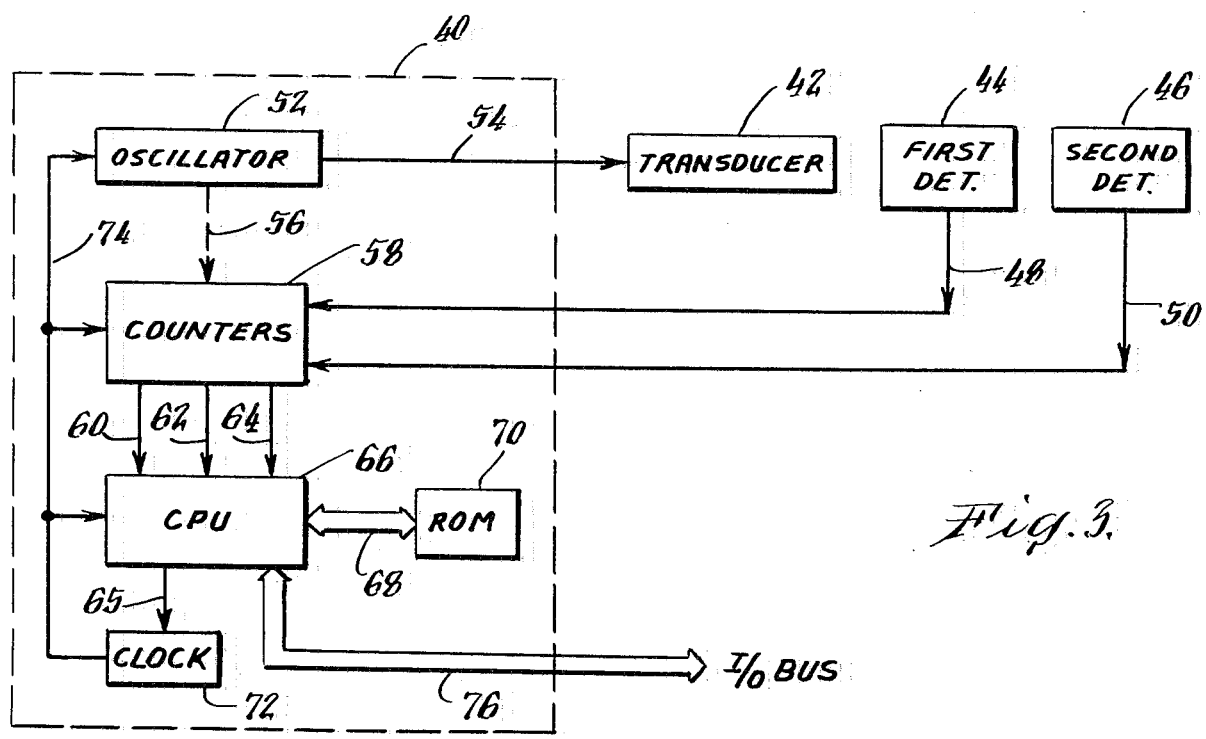

ACOUSTIC KEYBOARD

BACKGROUND OF THE INVENTION

The present invention relates to keyboards, and more particularly to a keyboard in which acoustic energy is used to identify the actuation of individual keys.

In the past, various types of keyboards have been used for entering data into typewriters, sales terminals, computers and the like. The type of keyboard is generally designated by the particular switching mechanism which is used in its keyswitches. Mechanical switches providing electrical contact between conductive electrodes, reed switches utilizing a magnetic field to close conductive electrodes, Hall-effect switches, and capacitive switches have all been used in past keyboard designs. Such past keyboards require the use of printed circuit boards and/or electromechanical components, which can be expensive. Reliability of such past keyboards can be adversely affected by contamination of switch contacts, dirt, harsh environments, and the like.

It would be advantageous to have a keyboard which is simple to manufacture, relatively inexpensive, and at the same time more reliable than past keyboards. The present invention provides such a keyboard by using acoustic energy to detect keyswitch actuation.

SUMMARY OF THE INVENTION

In accordance with the present invention, an acoustic keyboard is provided comprising a plurality of keys arranged in a matrix. A plurality of reflector members is provided, each associated with a different one of the keys for reflecting energy therefrom when the key is actuated. Transducer means emits acoustic energy for reflection from the actuators. Detector means detects acoustic energy reflected from the actuators. Means is provided for identifying actuated keys based upon the time it takes for energy emitted from the transducer means to reflect off of a given reflector member and reach the detector means. This time is referred to herein as "transit time".

The detector means can comprise first and second detectors mounted at different positions adjacent the matrix to establish, for each of the reflector members, a unique pair of transit times to identify each key. The identifying means can comprise a lookup table containing the unique transit time data for each reflector member. In a preferred embodiment, calibrating means is provided to compensate for transit time changes due to environmental factors. The calibrating means comprises means for periodically measuring the "direct transit time" of acoustic energy from the transducer means directly to at least one of the first and second detectors. Means is provided for scaling the unique transit time data for each reflector member by the percentage that the direct transit time varies from a base value.

BRIEF DESCRIPTION OF THE DRAWINGS

FIG. 1 is a cross-sectional view of a keyboard in accordance with the present invention, taken substantially along the line 1—1 of FIG. 2;

FIG. 2 is a top plan view of the keyboard of FIG. 1; and

FIG. 3 is a block diagram of electronic circuitry for use with the keyboard of the present invention.

DETAILED DESCRIPTION OF A PREFERRED EMBODIMENT

The present invention provides an acoustic keyboard, which operates by transmitting acoustic energy into a detection chamber, and measuring the time it takes the energy to travel to a reflector member associated with an actuated key, be reflected therefrom toward a detector, and to finally reach the detector. This transit time serves as an indication of which key has been actuated, because the keyboard is arranged such that no two keys will, upon actuation, result in the same transit times.

For purposes of this disclosure, the term: "acoustic" is not meant to be limited to sound waves per se. Rather, the term acoustic as used herein refers to any signal which propagates in the manner in which sound travels, i.e., by the displacement of molecules in the medium, such as air, through which the wave travels.

Referring to the drawings, a keyboard 10 includes a plurality of keys 14 arranged in a matrix. One of the keys is shown in an actuated position and is referred to by reference numeral 16. Key 16 is in all respects identical to keys 14, and is referred to herein by a unique reference number only for purposes of the following discussion.

Keys 14 can be of a conventional mechanical design, wherein a keytop mounted to a plunger is spring-loaded into its non-actuated position. Alternatively, keys 14 can comprise a plastic "sylfon" spring which is integrally molded with or otherwise attached to the top plate 11 of the keyboard 10. A sylfon spring is a tube which is deformed along its length, like a bellows, so that it is collapsable. Such a spring, molded from plastic, can be designed to impart virtually any desired feel to a keyboard user. Thus, the use of such a spring to form a keyswitch is advantageous. In addition, the construction of a keyboard using sylfon springs for the keys provides an economical, environmentally sealed structure.

As shown in FIG. 1, a reflector member 18 extends from each of the keys. An opening 15 is provided in top plate 11 for each of the keys, through which each of reflector members 18 can protrude when the key is actuated. Reflector member 18 associated with key 16, for example, is shown protruding through corresponding opening 15 in top plate 11. Reflector members 18 are fabricated from a material which reflects acoustic energy, such as plastic.

Keyboard 10 includes a detection chamber 12 into which reflector members 18 will project when their corresponding keys are actuated. The interior walls 13 of chamber 12 are preferably manufactured from an acoustic energy absorbing material, so that they will be nonreflecting and not interfere with the proper operation of the acoustic keyboard.

A transducer means 20 is mounted to emit acoustic energy into detection chamber 12 for reflection from any reflector member 18 which projects into detection chamber 12. First and second detectors 22 and 24, respectively, are mounted at different positions adjacent the matrix of keys 14, for detecting acoustic energy reflected thereto by any reflector member 18 which is projecting into detection chamber 12. It is noted that in a simple keyboard, it would be possible to use only one detector, arranged so that the transit time of an acoustic signal from the acoustic transducer to the detector, via reflection off of a reflector member 18, would be different for every key in the keyboard. In a preferred embodiment, however, first and second detectors 22 and 24 are used to establish, for each of reflector members 18, a unique pair of transit times to identify each key.

The present keyboard operates by determining the time required for acoustic energy to travel from the transducer to a reflector member, and on to the detector means. Since acoustic energy will be reflected only when a key is actuated, individual keys can be identified as long as each key results in a unique time period in which acoustic energy reflected by the key will reach the detector means.

Thus, for example, when key 16 is actuated, acoustic energy emitted from transducer 20 will travel along path 26 to the reflector member 18 associated with key 16. The acoustic energy will be reflected from reflector member 18 associated with key 16 along path 28 to first detector 22, and along path 30 to second detector 24. The amount of time it takes the acoustic energy to travel along path 26 and path 28 is one "transit time" associated with key 16. The amount of time it takes acoustic energy to travel along paths 26 and 30 is the other transit time associated with key 16. This pair of transit times will be unique to key 16. Since no two keys in the keyboard share the same pair of transit times, the transit times can be used to identify the actuation of individual keys.

Specific parameters for the keyboard construction are chosen in a straightforward manner. The velocity of sound is about 331 meters per second (approximately 1090 feet per second). Thus, if one were to choose an acoustic frequency of one megahertz (MHz), a wavelength of 0.33 millimeter would result, setting a limit of resolution for physical location of the keys. For accuracy, it is desirable to lay out the key matrix so that the reflected transit times have differences which are at least the equivalent of one wavelength of the acoustic energy. For a key spacing of 18 millimeters, which is fairly typical, the choice of an acoustic frequency of one MHz provides adequate resolution.

Since the velocity of sound is not constant, but goes down with a reduction in density and is dependent on humidity, temperature and altitude, it is desirable to provide a calibrating means to compensate for transit time changes due to environmental factors. One way to accomplish this is to periodically measure the direct transit time of acoustic energy from the transducer to at least one of the detectors, as shown in FIG. 2 by path 32 between transducer 20 and detector 22. The unique transit time data for each of reflector members 18 can then be scaled by the percentage that the direct transit time along path 32 varies from a predetermined base value.

FIG. 3 is a block diagram of electronic circuitry which can be used to implement the acoustic keyboard of the present invention. The bulk of the circuitry is contained on a single integrated circuit 40, as indicated by the dashed-line box.

Acoustic transducer 42 is driven by oscillator 52 via line 54. In order to enable the transit times to be determined, oscillator 52 initializes and starts counters 58, via line 56, each time transducer 42 is pulsed or otherwise periodically energized. Counters 58 monitor the outputs of first and second detectors 44 and 46 through lines 48 and 50, respectively. When first detector 44 detects energy reflected thereto by one of reflector members 18, a corresponding counter in counters 58 is stopped. The output of the stopped counter is transferred to central processing unit 66 across input line 60. Similarly, when second detector 46 detects acoustic energy which has been reflected to it, an associated counter in counters 58 is stopped and the count is transferred to central processing unit 66 across input line 62. Central processing unit 66 will then determine, on the basis of these counts (which form a unique pair of transit times) which of the keyboard keys has been actuated. One manner in which central processing unit 66 can accomplish this is to utilize the unique pair of transit times to address, via line 68, a lookup table stored in read only memory 70. At a memory location defined by the unique pair of transit times, read only memory 70 will contain the identification of the actuated key. The key identification can then be transferred, by central processing unit 66, to input/output bus 76 for use by the computer or other equipment (not shown) which is coupled thereto.

A clock 72 controls the timing of the various circuits contained in integrated circuit 40. A basic system clock rate of about 8 MHz will generally be appropriate for use in this system. Such a clock rate will allow for the generation of acoustic energy at an appropriate frequency and will provide sufficient resolution for the counting functions which measure the transit times.

In order to calibrate this system to compensate for environmental changes, the clock rate of clock 72 can be made adjustable so that the fixed counts which are to be decoded for key identification are always valid. This can be accomplished, as noted above, by periodically measuring the direct transit time of acoustic energy from transducer 42 directly to at least one of first and second detectors 44 and 46. A third counter in counters 58 can measure the direct transit time, and transfer the count established thereby to central processing unit 66 across input line 64. This information can then, in turn, be utilized by central processing unit 66 to modify the clock rate of clock 72, through the use of an appropriate signal transfered across line 65.

Those skilled in the art will appreciate that different types of acoustic signals can be utilized in implementing the present invention. For example, a continuous sine wave, or a continuous distorted wave can be used. Alternatively, a single or multiple acoustic signal with an intermittent duty cycle could be utilized. The frequency will be determined, as noted above, by the various spacing parameters required in the keyboard structure. In order to avoid the generation of annoying sounds, the acoustic frequency will preferably be in the ultrasonic range, i.e., above 20,000 Hz.

It will also be appreciated that reflector members other than the type shown in the drawings can be used in accordance with this invention. For example, the simple opening of a resonant depression in the top plate of the keyboard could be used to reflect acoustic energy. Such a structure would enable the elimination of separate pins which protrude into the keyboard detection chamber.

Although the invention has been described in connection with a preferred embodiment, the scope of the invention is not intended to be limited to the particular forms set forth herein. It is intended to cover such alternatives, modifications and equivalents as may be included within the spirit and scope of the invention as defined by the appended claims.

I claim:
1. An acoustic keyboard comprising:
a plurality of keys arranged in a matrix;
a plurality of reflector members, each associated with a different one of said keys and adapted to project into a detection chamber upon actuation of its associated key, for reflecting acoustic energy therefrom when the key is actuated;

transducer means for emitting acoustic energy into said detection chamber for reflection from said reflector members;

detector means for detecting acoustic energy reflected from said reflector members; and means for identifying actuated keys based upon the transit time of acoustic energy from said transducer means to said detector means via reflection off of the reflector members associated with the keys.

2. The keyboard of claim 1 wherein said detector means comprises first and second detectors mounted at different positions adjacent said matrix to establish, for each of said reflector members, a unique pair of transit times to identify each key.

3. The keyboard of claim 2 wherein said identifying means comprises a lookup table.

4. The keyboard of claim 2 further comprising calibrating means for compensating for variations in acoustic energy transit times due to environmental factors.

5. The keyboard of claim 4 wherein said calibrating means comprises means for periodically measuring the direct transit time of acoustic energy from said transducer means directly to at least one of said first and second detectors, and means for scaling the unique transit time data for each reflector member by the percentage that said direct transit time varies from a base value.

6. The keyboard of claim 2 wherein said acoustic energy has a frequency in the ultrasonic range.

7. An acoustic keyboard comprising:
a plurality of keys arranged in a matrix;
a plurality of reflector members each associated with a different one of said keys and adapted to project into a detection chamber when its associated key is actuated;

transducer means for emitting acoustic energy into said detection chamber;

detector means for detecting acoustic energy at opposite ends of said detection chamber;

means, coupled to said detector means, for measuring the transit times required for acoustic energy emitted from said transducer means to reflect off of a reflector member projecting into said chamber and travel to said opposite ends of said chamber; and means, responsive to measured transit times, for identifying individual keys when they are actuated.

8. The keyboard of claim 7 wherein the interior of said chamber is essentially non-reflecting.

9. The keyboard of claim 8 wherein said matrix, transducer means, and detector means are arranged so that each reflector member, when projected in to said chamber, has a unique set of transit times corresponding to it.

10. The keyboard of claim 9 wherein the means for identifying individual keys comprises a lookup table.

11. The keyboard of claim 9 further comprising calibrating means for compensating for variations in acoustic energy transit times due to environmental factors.

12. The keyboard of claim 11 wherein said calibrating means comprises means for measuring the direct transit time between said transducer and said detector means, without reflection off of a reflector member, and means for scaling the unique transit time data for each reflector member by the percentage that said direct transit time varies from a base value.

13. The keyboard of claim 7 wherein said acoustic energy has a frequency in the ultrasonic range.

* * * * *